(12) United States Patent
Chen et al.

(10) Patent No.: US 7,579,876 B1
(45) Date of Patent: Aug. 25, 2009

(54) MULTI-USE INPUT/OUTPUT PIN SYSTEMS AND METHODS

(75) Inventors: Yen-Chung T. Chen, Sunnyvale, CA (US); Hamid Reza Rategh, Cupertino, CA (US)

(73) Assignee: Scintera Networks, Inc., Sunnyvale, CA (US)

( * ) Notice: Subject to any disclaimer, the term of this patent is extended or adjusted under 35 U.S.C. 154(b) by 83 days.

(21) Appl. No.: 11/623,859

(22) Filed: Jan. 17, 2007

(51) Int. Cl.
*H03F 3/45* (2006.01)
(52) U.S. Cl. .......................................... 327/52; 327/53
(58) Field of Classification Search ....................... None
See application file for complete search history.

(56) References Cited

U.S. PATENT DOCUMENTS

| | | | | |
|---|---|---|---|---|
| 5,821,824 A * | 10/1998 | Mentzer | ....................... | 331/57 |
| 5,894,234 A * | 4/1999 | Morris | ......................... | 327/65 |
| 6,933,743 B2 * | 8/2005 | Cecchi et al. | .................. | 326/16 |
| 7,292,083 B1 * | 11/2007 | Wang et al. | .................. | 327/205 |
| 2004/0222821 A1* | 11/2004 | Ho et al. | ......................... | 327/65 |
| 2008/0042692 A1* | 2/2008 | Gebara et al. | .................. | 327/65 |

* cited by examiner

*Primary Examiner*—Tuan Lam
*Assistant Examiner*—Hiep Nguyen
(74) *Attorney, Agent, or Firm*—Haynes and Boone, LLP

(57) ABSTRACT

Systems and methods provide multi-use input/output (I/O) pads for an integrated circuit. For example in accordance with an embodiment, the multi-use pads may be shared to support different integrated circuit functions via the pads, such as selectively for high-speed signaling or general I/O.

15 Claims, 3 Drawing Sheets

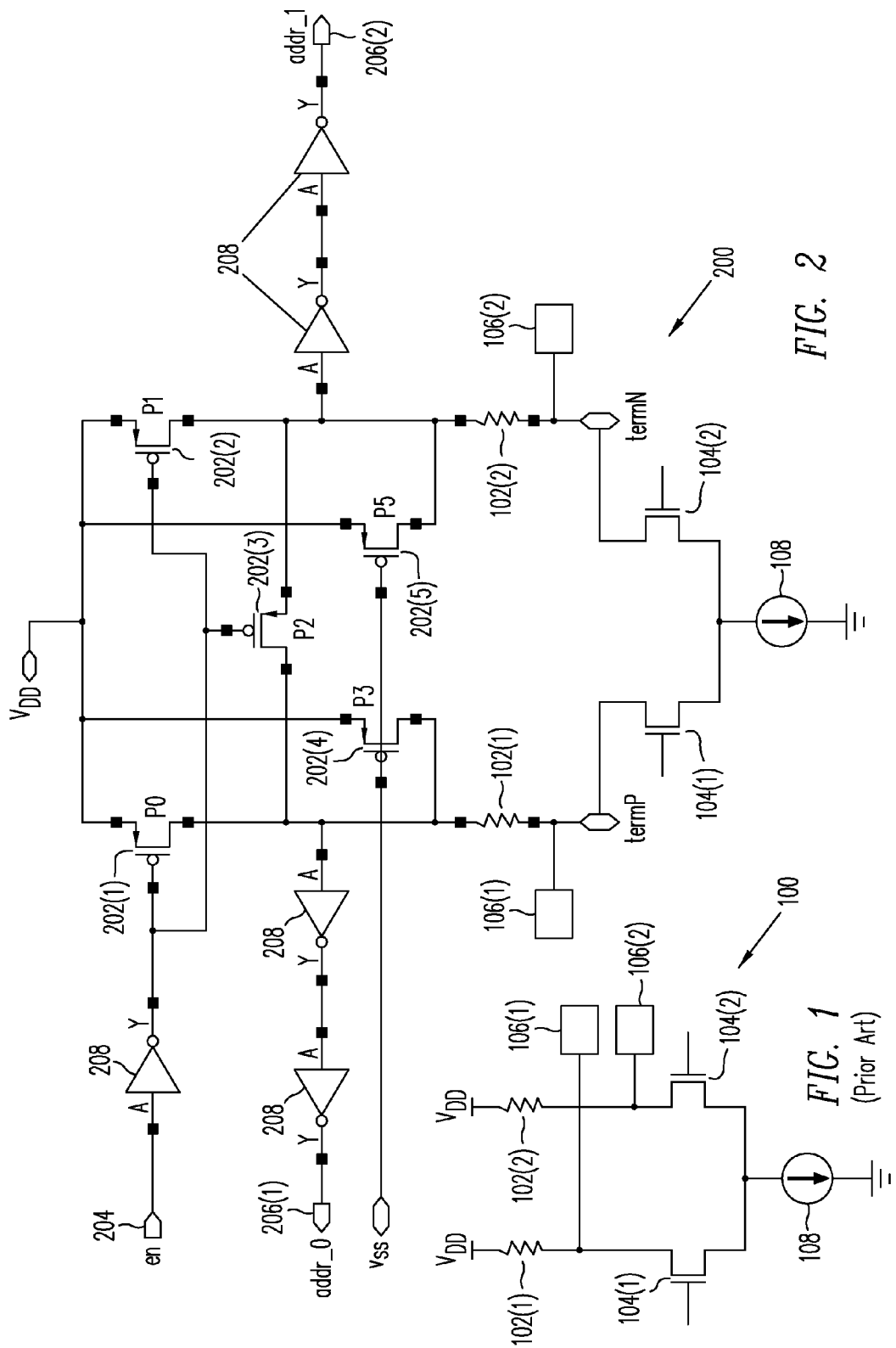

US 7,579,876 B1

MULTI-USE INPUT/OUTPUT PIN SYSTEMS AND METHODS

TECHNICAL FIELD

The present invention relates generally to electrical circuits and, more particularly, to multi-use techniques for input/output pins, such as for example for high-speed integrated circuit applications and other applications.

BACKGROUND

An integrated circuit generally provides only a limited number of input/output (I/O) pads, which may limit the number of functions provided by the integrated circuit. A conventional approach to providing more functions may involve increasing the number of pads and package pins, but this approach typically requires an increase in die area along with an increase in manufacturing costs. The number of integrated circuit package pins may also be limited due to packaging or physical geometry constraints for a desired application.

As a result, there is a need for improved techniques for utilizing I/O pads and package pins.

SUMMARY

Systems and methods are disclosed in accordance with one or more embodiments of the present invention to provide multi-use input/output (I/O) pads (e.g., integrated circuit pads or pins). For example in accordance with an embodiment, the multi-use pads may be shared to support different integrated circuit functions via the pads, such as selectively for high-speed signaling or general I/O (e.g., for providing address bits).

More specifically for example, in accordance with one embodiment of the present invention, an integrated circuit includes a first transistor and a second transistor, wherein the first and second transistors are adapted to receive input signals at their gate terminals; a bias circuit coupled between the first and second transistors and a reference voltage terminal; a first resistor and a second resistor coupled to a corresponding first terminal of the first and second transistors, respectively; a first pad and a second pad coupled to the corresponding first terminal of the first and second transistors, respectively; a third transistor and a fourth transistor coupled between a supply voltage terminal and the first and second resistors, respectively, wherein the third and fourth transistors are adapted to receive a control signal at their gate terminals; and wherein the integrated circuit is adapted to provide a first signal type via the first and second pads in the event that the control signal provides a first voltage level, and wherein the integrated circuit is adapted to receive a second signal type via the first and second pads in the event that the control signal provides a second voltage level.

In accordance with another embodiment of the present invention, an interface circuit of an integrated circuit includes a first transistor and a second transistor, wherein the first and second transistors are adapted to receive input signals at their gate terminals; a bias circuit coupled between the first and second transistors and a reference voltage terminal; a first resistor and a second resistor coupled to the first and second transistors, respectively; means for providing an interface path between the interface circuit and devices external to the integrated circuit, wherein the providing means is coupled to the first and second transistors; a third transistor and a fourth transistor coupled between a supply voltage terminal and the first and second resistors, respectively, wherein the third and fourth transistors are adapted to receive a control signal at their gate terminals; and wherein the interface circuit is adapted to provide output signals via the providing means based on the input signals in the event that the control signal provides a first voltage level, and wherein the interface circuit is adapted to receive first input signals via the providing means in the event that the control signal provides a second voltage level.

In accordance with another embodiment of the present invention, a method of sharing an interface of an integrated circuit includes providing a first pad and a second pad; and providing an interface circuit coupled to the first and second pads, wherein the interface circuit is responsive to a control signal to use the first and second pads to provide driver output signals in the event that the control signal provides a first voltage level, and to use the first and second pads for input signals and/or output signals in the event that the control signal provides a second voltage level.

In accordance with another embodiment of the present invention, a method of sharing pads of an interface circuit within an integrated circuit includes providing a control signal having a first voltage level to the interface circuit, wherein the interface circuit is responsive to the first voltage level to configure itself to receive input signals provided to transistors of the interface circuit and provide output signals via the pads of the interface circuit based on the input signals; and providing the control signal having a second voltage level to the interface circuit, wherein the interface circuit is responsive to the second voltage level to configure itself to receive first input signals via the pads of the interface circuit.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 1 shows a circuit diagram illustrating a conventional interface circuit.

FIG. 2 shows a circuit diagram illustrating an integrated circuit having an interface circuit in accordance with an embodiment of the present invention.

Embodiments of the present invention and their advantages are best understood by referring to the detailed description that follows. It should be appreciated that like reference numerals are used to identify like elements illustrated in one or more of the figures.

DETAILED DESCRIPTION

Figure 3:
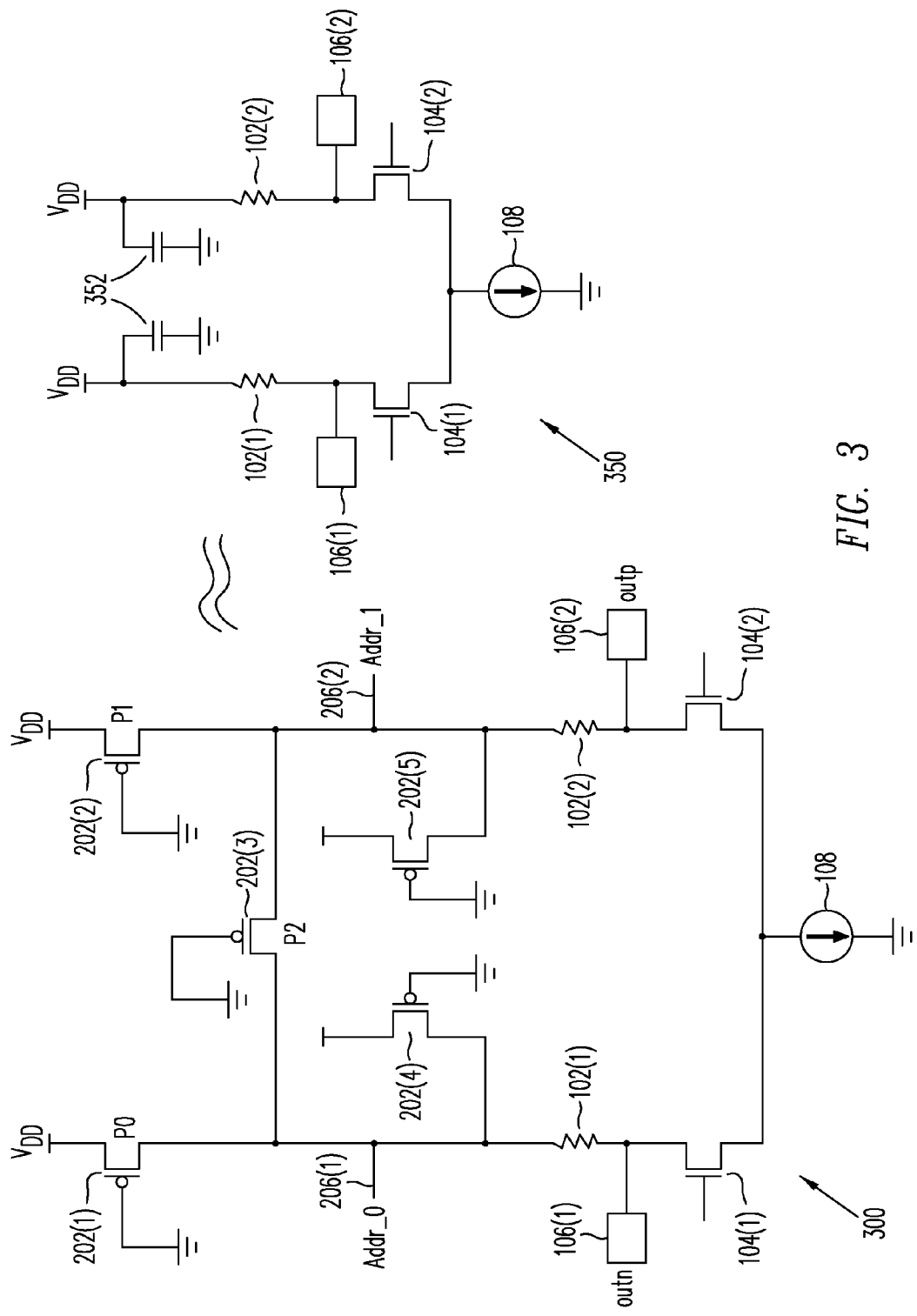
FIG. 3 shows a circuit diagram illustrating an exemplary circuit representation for a first mode of the interface circuit in accordance with an embodiment of the present invention.

FIG. 1 shows a general diagram of a conventional interface circuit 100 (e.g., a common mode logic (CML) output driver). Circuit 100 includes resistors 102 (e.g., two 50Ω resistors labeled as resistors 102(1) and 102(2)), transistors 104, pads 106, and a bias circuit 108 (e.g., a current source or current bias transistor). Resistors 102(1) and 102(2) are coupled to corresponding transistors 104(1) and 104(2) and provided with a supply voltage (labeled $V_{DD}$). As would be understood by one skilled in the art, circuit 100 receives input signals (e.g., an input signal pair having a common mode voltage level) at corresponding gate terminals of transistors 104(1) and 104(2) (e.g., a differential transistor pair) and provides output signals via pads 106(1) and 106(2).

As noted above, a conventional approach to providing more functions may involve increasing the number of pads on the integrated circuit. For example, pads 106 of interface circuit 100 generally may only be used by the CML output driver to provide output signals via pads 106, while if other functions are desired, then additional pads must be included in the integrated circuit incorporating interface circuit 100. Thus, the conventional approach would provide dedicated pads for high-speed signal paths as typical multiplexing or tri-state approaches would add undesirable loading and/or prevent the preservation of the high bandwidth requirement for high-speed signaling applications.

In contrast in accordance with one or more embodiments of the present invention, systems and methods are disclosed to provide multi-use input/output (I/O) pads. Pads are referred to herein for embodiments in a broad sense to indicate bonding pads, leads, or pins of the integrated circuit (e.g., wherein pads form at least part of an interface with external devices). For example, FIG. 2 shows generally an integrated circuit diagram illustrating an interface circuit 200 in accordance with an embodiment of the present invention. Interface circuit 200 includes resistors 102, transistors 104, pads 106, bias circuit 108, and transistors 202. Interface circuit 200 may also include optional inverters 208.

A control signal 204 (labeled en) is provided to gate terminals of transistors 202(1), 202(2), and 202(3), while gate terminals of transistors 202(4) and 202(5) are provided with a ground or reference voltage level (labeled vss). Control signal 204 allows the selection of different operating modes for interface circuit 200 to provide different types of signals through pads 106 and utilize pads 106 as multi-use pads.

Control signal 204 may be an external signal provided to the integrated circuit of interface circuit 200. Alternatively, control signal 204 may be provided from within the integrated circuit of interface circuit 200. As an example, the integrated circuit of interface circuit 200 may include control registers (not shown) that store information provided by an external microcontroller through a processor interface (e.g., an I2C interface) with the integrated circuit. One of the control registers stores a bit which determines a logical value of control signal 204.

For example for this exemplary implementation, pads 106 of interface circuit 200 may be used as high-speed pads for the CML output driver or as general I/O pads (e.g., for providing address signals to the integrated circuit incorporating interface circuit 200). As an example of operation for a first mode, a logic high signal level provided by control signal 204 will be inverted by inverter 208 and cause transistors 202(1), 202(2), and 202(3) to switch on (e.g., operate in the triode region). Transistors 202(1) and 202(2) may provide low impedance paths (e.g., by proper sizing as would be understood by one skilled in the art) between the supply voltage (labeled vdd or $V_{DD}$) and corresponding resistors 102(1) and 102(2). Transistor 202(3) may also provide a low impedance path and may also equalize any voltage differences between the two paths or branches from the supply voltage (vdd) to resistors 102(1) and 102(2). Thus, when transistors 202(1), 202(2), and 202(3) are switched on, a good supply voltage path is maintained to resistors 102(1) and 102(2) and an output impedance of interface circuit 200 (e.g., as a CML output driver) is not changed significantly. Signal paths 206(1) and 206(2) (labeled addr_1 and addr_0) for this mode may be viewed as being shorted to each other and to the supply voltage (vdd). Transistors 202(4) and 202(5) are always switched on and may be sized appropriately small (e.g., relative to transistors 202(1), 202(2), and 202(3)) to function as small leakage current devices between the supply voltage (vdd) and corresponding resistors 102(1) and 102(2).

Referring briefly to FIG. 3, exemplary circuits 300 and 350 provide general circuit representations for a first mode of operation of interface circuit 200 in accordance with an embodiment of the present invention. Specifically, circuit 300 represents the configuration of interface circuit 200 when a logic high signal level is provided by control signal 204 (FIG. 2), as discussed previously. As illustrated in FIG. 3, interface circuit 200 may be configured and function in a similar fashion as conventional interface circuit 100 (FIG. 1), with circuit 350 providing an approximately equivalent representation of circuit 300 for interface circuit 200 when control signal 204 provides the logic high signal level. For example, circuit 350 may include capacitors 352 that represent capacitive loading due to transistors 202, but capacitors 352 generally do not adversely affect high-speed operation of the first mode of operation (e.g., no bandwidth reduction) and may provide certain benefits (e.g., desirable symbiotic bypass capacitor). Thus, for the first exemplary mode of operation, interface circuit 200 may be configured to utilize pads 106 as a driver circuit (e.g., a CML output driver).

Returning to FIG. 2, a second exemplary mode of operation for interface circuit 200 may be implemented by providing a logic low signal level for control signal 204, which will be inverted by inverter 208 and cause transistors 202(1), 202(2), and 202(3) to switch off. Control signal 204 may also be provided to bias circuit 108 (or a separate control signal may be provided to bias circuit 108) to switch off bias circuit 108. Similarly, control signal 204 (or a separate control signal) may be employed to switch off transistors 104.

Thus, for the second mode of operation of interface circuit 200, transistors 202(1), 202(2), and 202(3) along with bias circuit 108 and transistors 104(1) and 104(2) are switched off (blocking the corresponding supply voltage (vdd) and ground or reference voltage paths through these circuit elements), which allows pads 106 to be used as general I/O pads. For example for the second mode of operation, pads 106 may be used for low frequency digital or analog I/O, such as for this exemplary implementation to provide address signals via pads 106 to the integrated circuit incorporating interface circuit 200.

Figure 4:
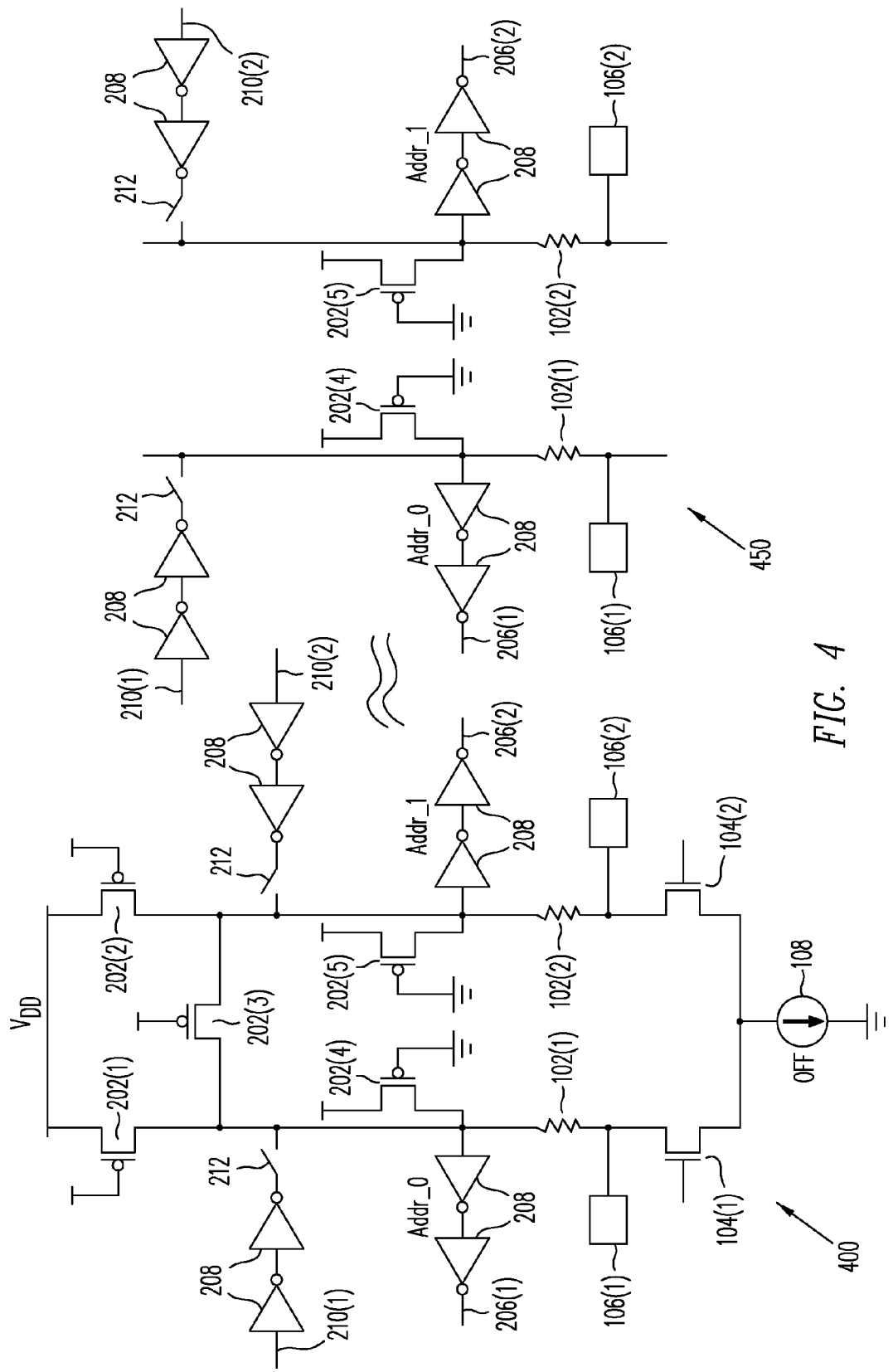
FIG. 4 shows a circuit diagram illustrating an exemplary circuit representation for a second mode of the interface circuit in accordance with an embodiment of the present invention.

Referring briefly to FIG. 4, exemplary circuits 400 and 450 provide general circuit representations for a second mode of operation of interface circuit 200 in accordance with an embodiment of the present invention. Specifically, circuit 400 represents the configuration of interface circuit 200 when a logic low signal level is provided by control signal 204 (FIG. 2), as discussed previously, with circuit 450 providing an approximately equivalent representation of circuit 400 for interface circuit 200 when control signal 204 provides the logic low signal level.

For this particular exemplary implementation for the second mode of operation (FIG. 4), external address signals may be provided via pads 106 to interface circuit 200 (e.g., to address the particular integrated circuit incorporating interface circuit 200). For example, if pads 106 are not connected externally to the integrated circuit, then signal paths 206(1) and 206(2) are pulled to a high logic level by transistors 202(4) and 202(5) (i.e., the two small leakage transistors). If pads 106 are connected to an external ground voltage path (e.g., through a low impedance path), a low logic level will be provided via pads 106 to signal paths 206(1) and 206(2) as transistors 202(4) and 202(5) will be overpowered and will be unable to maintain the high logic level on signal paths 206(1) and 206(2). Similarly if pad 106(1) or 106(2) is connected to an external ground voltage path, a low logic level will be provided to corresponding signal path 206(1) or 206(2).

As an implementation example, external jumper connections may provide a logical low or high signal level independently to pad 106(1) and 106(2) (e.g., via pins of the integrated circuit) to provide the desired address signal (e.g., 00, 01, 10, or 11) to the integrated circuit incorporating interface circuit 200. Thus, a desired input signal (e.g., address bits) may be provided via pads 106 and signal paths 206, such as to provide an address signal to designate the integrated circuit to be programmed or otherwise addressed within a system having a number of integrated circuits.

It should also be understood that inverters 208 on signal paths 206 are optional. Thus, if inverters 208 are not present, signal paths 206 may be used with pads 106 to provide I/O signal paths for the second mode of operation of interface circuit 200, rather than using signal paths 206 as only input signal paths via inverters 208 as illustrated in FIG. 4. Alternatively, additional signal paths 210 may be included for interface circuit 200, as illustrated in FIG. 4, to provide a signal path for output signals. For example, output signals may be provided on signal path 210(1) and/or 210(2) and provided via pads 106 to external circuits or devices. Inverters 208 may be optionally provided on signal paths 210. A switch 212 (e.g., a transistor or a transmission gate) may also be optionally provided and employed to control when output signals may be provided via signal paths 210(1) and/or 210(2) to corresponding pads 106.

As discussed herein, interface circuit 200 may function in different selectable modes to provide general low frequency I/O or high frequency I/O operation via pads 106. Thus, pads 106 (the multi-use pads) may be employed for a variety of purposes, such as for example for high-speed pads or as low speed pads (allowing the sharing of pads between high-speed signals and unrelated low-speed signals), without adding parasitic loads to or reducing bandwidth and performance of the high-speed pad operations. As a specific example, pads 106 may be used to receive address bits and provide output signals or may be used for any general purpose digital or analog I/O signal. For example, in a first mode of operation, high-speed output signals may be provided from the interface circuit via pads 106, while in a second mode of operation, general I/O signals may be transferred via the same pads 106 via a common I/O signal path or separate input signal paths and output signal paths (e.g., as discussed in reference to FIG. 4).

In general, systems and methods are disclosed herein to provide multi-use pads. For example, in accordance with an embodiment of the present invention, multi-use I/O pads allow sharing of the pads to support different integrated circuit functions. As a specific example, the interface circuit may allow different signals to/from the integrated circuit via the pads, such as for either high-speed signaling or low-speed signaling (e.g., address signals). Thus, the multi-use pad techniques disclosed herein may reduce costs and provide a smaller package size relative to conventional approaches. Furthermore, by more fully utilizing certain pads, the technique allows the remaining pads to be employed for other critical signal functions. The techniques disclosed herein may be further replicated and applied to various types of interface circuits within an integrated circuit to provide any desired number of multi-use pads.

Embodiments described above illustrate but do not limit the invention. It should also be understood that numerous modifications and variations are possible in accordance with the principles of the present invention. Accordingly, the scope of the invention is defined only by the following claims.

What is claimed is:

1. An integrated circuit comprising:
 a first transistor and a second transistor, wherein the first and second transistors are adapted to receive input signals at their gate terminals;
 a bias circuit coupled between the first and second transistors and a reference voltage terminal;
 a first resistor and a second resistor coupled to a corresponding first terminal of the first and second transistors, respectively;
 a first pad and a second pad coupled to the corresponding first terminal of the first and second transistors, respectively;
 a third transistor and a fourth transistor coupled between a supply voltage terminal and the first and second resistors, respectively, wherein the third and fourth transistors are adapted to receive a control signal at their gate terminals; and
 wherein the integrated circuit is adapted to provide a first signal type via the first and second pads in the event that the control signal provides a first voltage level, and wherein the integrated circuit is adapted to receive a second signal type via the first and second pads in the event that the control signal provides a second voltage level, and wherein the bias circuit and the first and second transistors are switched off in the event that the control signal provides the second voltage level.

2. The integrated circuit of claim 1, further comprising a fifth transistor coupled between the first resistor and the second resistor and adapted to receive the control signal at its gate terminal, wherein the fifth transistor electrically couples the first resistor and the second resistor in the event that the control signal provides the first voltage level and switches off in the event that the control signal provides the second voltage level.

3. The integrated circuit of claim 1, further comprising a fifth transistor and a sixth transistor coupled between the supply voltage terminal and the first and second resistors, respectively, wherein the fifth and sixth transistors are adapted to receive a reference voltage that maintains the fifth and sixth transistors in a switched on condition.

4. The integrated circuit of claim 3, wherein the fifth and sixth transistors are sized appropriately such that a voltage level provided via the first and second pads by the second signal type overcomes a voltage level provided by the fifth and sixth transistors.

5. The integrated circuit of claim 1, wherein the first and second pads are used as driver output pads for the first signal type in the event that the control signal provides the first voltage level, and wherein the first and second pads are used as general input/output pads in the event that the control signal provides the second voltage level.

6. The integrated circuit of claim 5, wherein the second signal type is an address signal provided to the integrated circuit via the first pad and/or the second pad in the event that the control signal provides the second voltage level.

7. The integrated circuit of claim 1, further comprising:
 a first signal path coupled to the first resistor, wherein the first signal path is adapted to receive input signals and/or provide output signals via the first pad in the event that the control signal provides the second voltage level; and a second signal path coupled to the second resistor, wherein the second signal path is adapted to receive input signals and/or provide output signals via the second pad in the event that the control signal provides the second voltage level.

8. The integrated circuit of claim 7, further comprising:
a fifth transistor and a sixth transistor coupled between the supply voltage terminal and the first and second resistors, respectively, wherein the fifth and sixth transistors are adapted to receive a reference voltage that maintains the fifth and sixth transistors in a switched on condition; and
a seventh transistor coupled between the first resistor and the second resistor and adapted to receive the control signal at its gate terminal, wherein the seventh transistor electrically couples the first resistor and the second resistor in the event that the control signal provides the first voltage level and switches off in the event that the control signal provides the second voltage level.

9. An interface circuit of an integrated circuit, the interface circuit comprising:
a first transistor and a second transistor, wherein the first and second transistors are adapted to receive input signals at their gate terminals;
a bias circuit coupled between the first and second transistors and a reference voltage terminal;
a first resistor and a second resistor coupled to the first and second transistors, respectively;
means for providing an interface path between the interface circuit and devices external to the integrated circuit, wherein the providing means is coupled to the first and second transistors;
a third transistor and a fourth transistor coupled between a supply voltage terminal and the first and second resistors, respectively, wherein the third and fourth transistors are adapted to receive a control signal at their gate terminals; and
wherein the interface circuit is adapted to provide output signals via the providing means based on the input signals in the event that the control signal provides a first voltage level, and wherein the interface circuit is adapted to receive first input signals via the providing means in the event that the control signal provides a second voltage level, and wherein the bias circuit and the first and second transistors are switched off in the event that the control signal provides the second voltage level.

10. The interface circuit of claim 9, further comprising means for equalizing voltage levels provided to the first and second resistors in the event that the control signal provides the first voltage level.

11. The interface circuit of claim 9, further comprising a fifth transistor and a sixth transistor coupled between the supply voltage terminal and the first and second resistors, respectively, wherein the fifth and sixth transistors are adapted to receive a reference voltage that maintains the fifth and sixth transistors in a switched on condition, wherein the fifth and sixth transistors are sized appropriately such that a voltage level provided via the first and second pads by the first input signals overcomes a voltage level provided by the fifth and sixth transistors.

12. The interface circuit of claim 9, wherein the interface circuit is used to provide a general input/output signal interface via the providing means in the event that the control signal provides the second voltage level.

13. The interface circuit of claim 12, wherein the first input signals are address signals provided to the integrated circuit via the providing means in the event that the control signal provides the second voltage level; and wherein the interface circuit further comprises:
a first signal path coupled to the first resistor, wherein the first signal path is adapted to receive the first input signals and/or provide first output signals via the providing means in the event that the control signal provides the second voltage level; and
a second signal path coupled to the second resistor, wherein the second signal path is adapted to receive the first input signals and/or provide second output signals via the providing means in the event that the control signal provides the second voltage level.

14. A method of sharing pads of an interface circuit within an integrated circuit, the method comprising:
providing a control signal having a first voltage level to the interface circuit, wherein the interface circuit is responsive to the first voltage level to configure itself to receive input signals provided to transistors of the interface circuit and provide output signals via the pads of the interface circuit based on the input signals;
providing the control signal having a second voltage level to the interface circuit, wherein the interface circuit is responsive to the second voltage level to configure itself to receive first input signals via the pads of the interface circuit; and
maintaining a weak supply voltage level to resistors of the interface circuit, wherein the weak supply voltage level is overpowered in the event that the first input signals provide a voltage level different than the weak supply voltage level.

15. The method of claim 14, further comprising equalizing voltage levels provided to the transistors of the interface circuit in the event that the control signal is at the first voltage level.

* * * * *